United States Patent
Hollmer et al.

[11] Patent Number: 6,005,804
[45] Date of Patent: Dec. 21, 1999

[54] SPLIT VOLTAGE FOR NAND FLASH

[75] Inventors: Shane C. Hollmer, San Jose; Binh Quang Le, Mountain View; Pau-ling Chen, Saratoga, all of Calif.

[73] Assignee: Advanced Micro Devices, Inc., Sunnyvale, Calif.

[21] Appl. No.: 08/993,634

[22] Filed: Dec. 18, 1997

[51] Int. Cl.$^6$ .................................................. G11C 16/00
[52] U.S. Cl. .............................. 365/185.17; 365/185.18; 365/185.27; 365/185.28
[58] Field of Search ...................... 365/185.17, 185.27, 365/185.28, 185.18, 226

[56] References Cited

U.S. PATENT DOCUMENTS

| | | | |
|---|---|---|---|
| 4,959,812 | 9/1990 | Momodomi et al. | 365/185.27 |
| 5,179,427 | 1/1993 | Nakayama et al. | 365/185.27 |
| 5,293,337 | 3/1994 | Aritome et al. | 365/185.17 |
| 5,394,372 | 2/1995 | Tanaka et al. | 365/185.09 |
| 5,514,889 | 5/1996 | Cho et al. | 365/185.27 |
| 5,521,864 | 5/1996 | Kobayashi et al. | 365/185.17 |
| 5,568,420 | 10/1996 | Lim et al. | 365/185.17 |
| 5,572,464 | 11/1996 | Iwasa | 365/185.27 |
| 5,600,592 | 2/1997 | Atsumi et al. | 365/185.27 |
| 5,657,271 | 8/1997 | Mori | 365/185.27 |
| 5,671,176 | 9/1997 | Jang et al. | 365/185.27 |
| 5,708,588 | 1/1998 | Haddad et al. | 365/185.27 |
| 5,742,541 | 4/1998 | Tanigami et al. | 365/185.27 |
| 5,818,758 | 10/1998 | Wojciechowski | 365/185.27 |

*Primary Examiner*—Tan T. Nguyen
*Attorney, Agent, or Firm*—Skjerven, Morrill, MacPherson, Franklin & Friel LLP; Edward C. Kwok

[57] ABSTRACT

An EEPROM NAND array has floating gate memory cells coupled in series, each having a control gate, a floating gate, a body region, and an insulating layer between the floating gate and the body region. A negative charge pump is coupled to the body region. In programming, the body region of the memory cell selected for programming is biased to a negative voltage by the negative charge pump while the control gate of the memory cell is biased to a predetermined positive voltage sufficient to induce Fowler-Nordheim tunneling from the body region into the floating gate. The present invention allows the programming voltage requirement at the control gate of a NAND EEPROM memory cell to be significantly reduced which allows for the peripheral voltage delivery circuitry in NAND EEPROM arrays to be designed for lower voltages than for conventional NAND EEPROM arrays.

8 Claims, 3 Drawing Sheets

SPLIT VOLTAGE FOR NAND FLASH

FIELD OF THE INVENTION

The present invention relates to electrically erasable and programmable read-only memory (EEPROM) technology. More specifically, it relates to EEPROM's having NAND gate array structures (NAND EEPROM).

BACKGROUND OF THE INVENTION

NAND EEPROM based non-volatile flash memory architecture is described in U.S. Pat. No. 5,568,420, filed Nov. 30, 1994, and entitled "Nonvolatile Semiconductor Memory Device"; and on pages 119–120 and 124–126 of *Semiconductor Memories* (ISBN number: 0-7803-1000-4), which are incorporated herein by reference in their entirety.

One problem with the conventional NAND array memory device is described with reference to FIG. 1 which is a cross sectionl adiagram of a conventional floating gate memory cell 100 of a NAND array. The memory cell 100 is a floating gate transistor having a control gate 102 separated from a polycrystalline silicon floating gate 106 by an upper insulating layer 104, the floating gate 106 being separated from a substrate 110 by a lower insulating layer 108. The substrate 110 includes an n+source region 112, a p-doped body region 114, and an n+drain region 116 as in a conventional NMOS enhancement mode transistor.

In order to program the conventional floating gate memory cell 100, control gate 102 is biased at a relatively high voltage of approximately 20 volts while body region 114 is grounded. The high voltage on the control gate 102 induces electrons from body region 114 to tunnel through the lower insulation layer 108 and into floating gate 106 through a conventionally known process called Fowler-Nordheim tunneling. The floating gate 106 accumulates a negative charge thereby increasing the threshold voltage of the memory cell 100. Erasing occurs by biasing the body region 114 at a high voltage of approximately 20 volts while the control gate 102 is grounded causing the electrons from floating gate 106 to tunnel through lower insulation layer 108 and into the body region 114.

This conventional memory cell structure and process require that the peripheral delivery circuitry such as decoders and charge pumps contain devices capable of processing and producing at least 20 volts. The design for circuits capable of processing and producing high voltages of, for example, 20 volts are more complex, require more space, and have more complex transistor technology than do circuits for lower voltage applications.

Therefore, what is desired is an improved structure and method for reducing the voltage requirements of the peripheral circuitry for delivery of voltages to the control gate and body region of a floating gate memory cell in a NAND array.

SUMMARY OF THE INVENTION

An EEPROM NAND array has floating gate memory cells coupled in series, each having a control gate, a floating gate, a body region, and an insulating layer between the floating gate and the body region. A negative charge pump is coupled to the body region. In programming, the body region of the memory cell selected for programming is biased to a negative voltage by the negative charge pump while the control gate of the memory cell is biased to a predetermined positive voltage sufficient to induce Fowler-Nordheim tunneling from the body region into the floating gate. The present invention allows the programming voltage requirement at the control gate of a NAND EEPROM memory cell to be significantly reduced which allows for the peripheravoltage delivery circuitry in NAND EEPROM arrays to be designed for lower voltages than for conventional NAND EEPROM arrays.

DESCRIPTION OF THE INVENTION

Figure 2:
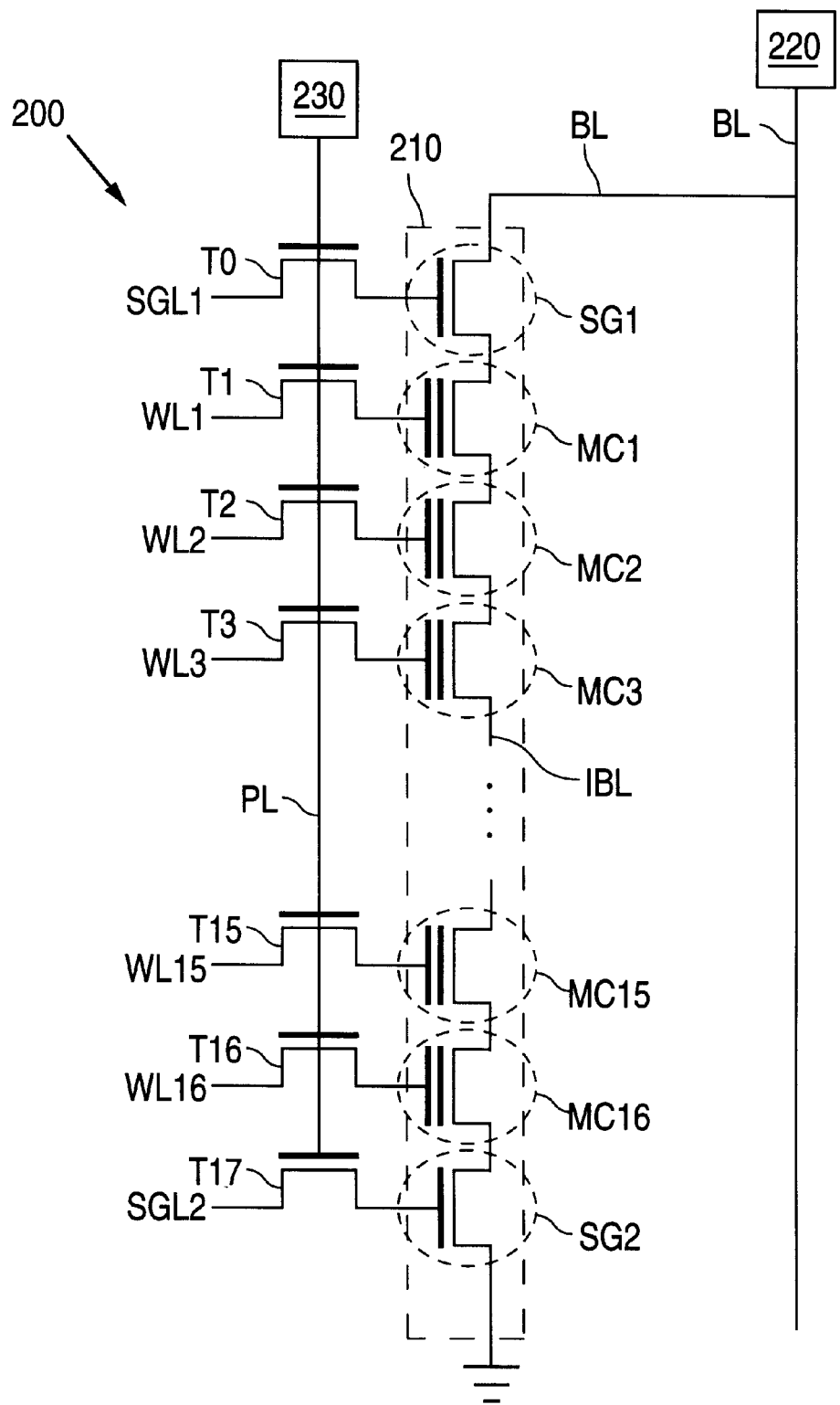
FIG. 2 is a schematic diagram of a NAND array block of the present invention.

FIG. 2 is a schematic diagram of a NAND array block 200 of the present invention. Block 200 includes an external line BL coupled to a sense amplifier 220 for detecting voltage changes on external bit line BL. External bit line BL is selectively coupled to an internal bit line IBL which is a NAND structure of 16 floating memory cell is MC1 to MC16 coupled in series, of which, for clarity reasons, only memory cell is MC1 to MC3 and MC15 to MC16 are shown in FIG. 2. A string 210 includes first and second select gate transistors SG1 and SG2 for respectively and selectively coupling the internal bit line IBL to external line BL and a voltage source (e.g. ground).

Each control gate of memory cell is MC1 to MC16 are coupled to a respective word lines WL1 to WL16 while each control gate of select gate transistors SG1 and SG2 are coupled to a respective select gate lines SG1 and SGL2. Each line SBL1, SGL2, and WL1 to WL16 contains a respective pass transistor T0 to T17 coupled to charge pump 230 by pump line PL for passing voltages on lines SGL1, SGL2, and WL1 to WL16 to the respective controgates of memory cell is SG1, SG2, and MC1 to MC16.

Figure 3:
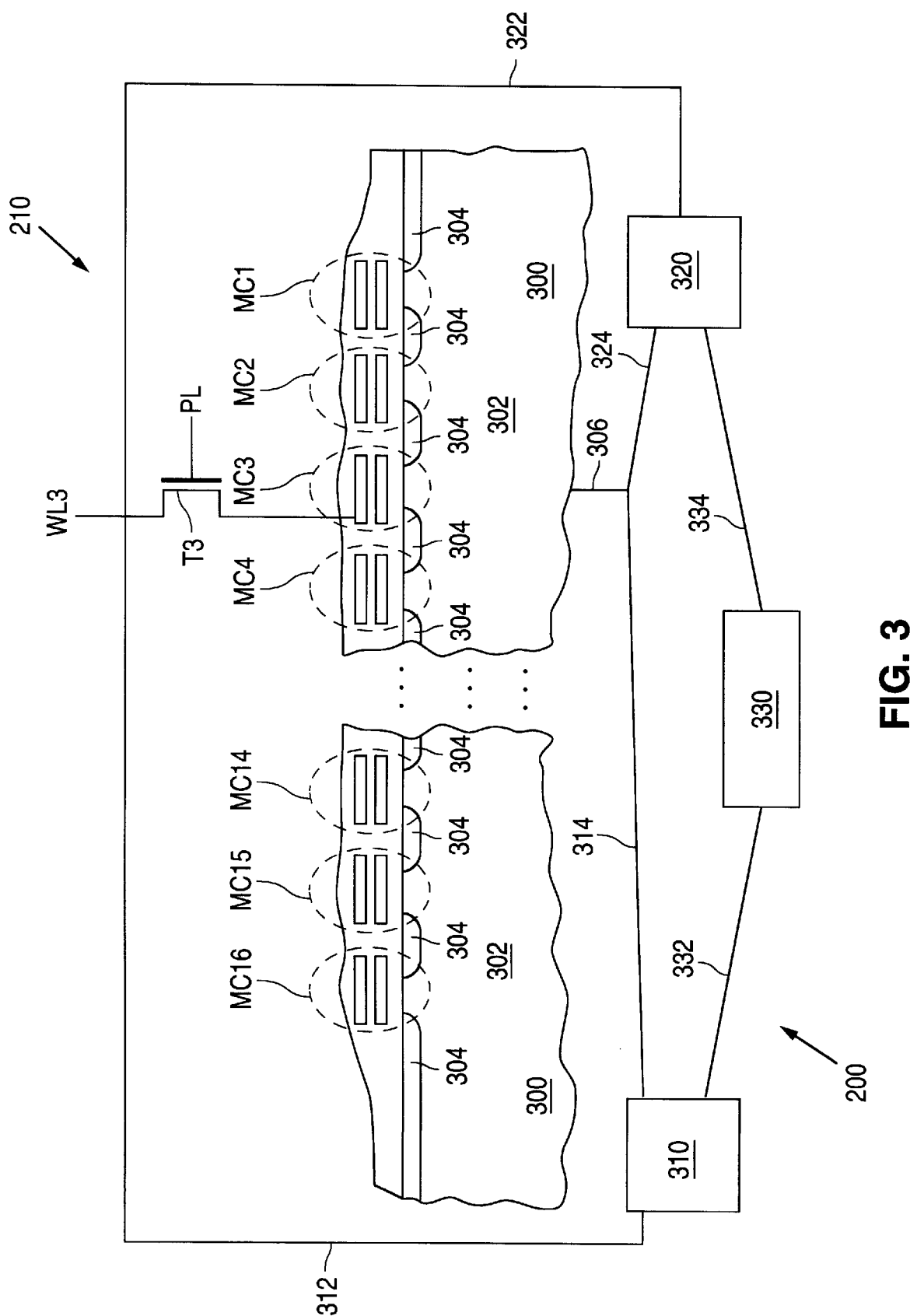
FIG. 3 is a cross sectional diagram of string 210 of FIG. 2 as disposed on a substrate 300.

FIG. 3 is a cross sectional diagram of string 210 of FIG. 2 as disposed on a substrate 300. Memory cell ls MC1 to MC16, of which, for clarity reasons, only memory cell is MC1 to MC4 and MC14 to MC16 are shown in FIG. 3, are disposed on a substrate 300. Substrate 300 includes a p-welregion 302 which is a body region for memory cell is MC1 to MC16. P-well body region 302 is coupled to a substrate bias line 306 for providing a bias voltage and charge to p-well body region 302. Substrate 300 has n-doped regions 304 disposed therein to form source and drain regions for memory cell is MC1 to MC16.

Figure 1:
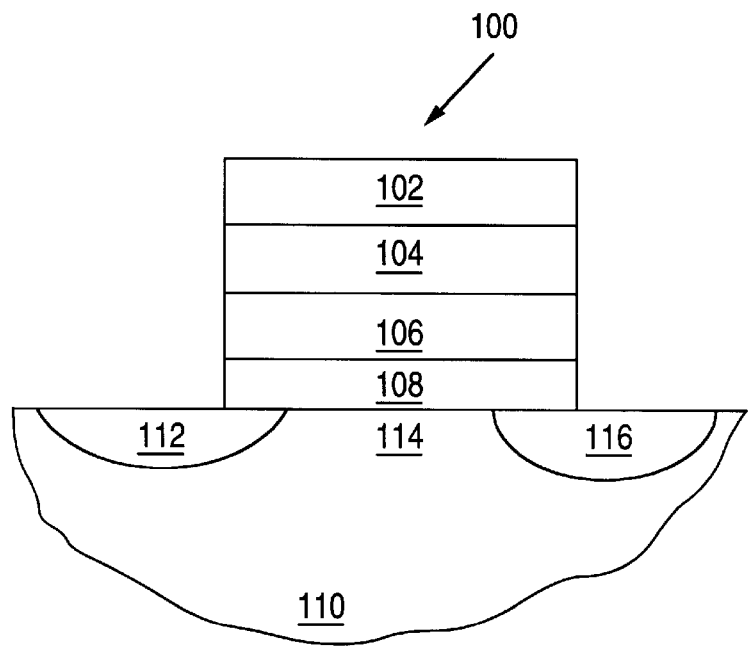
FIG. 1 is a cross sectional diagram of a conventional floating gate memory cell of a NAND array.
Figure 4:
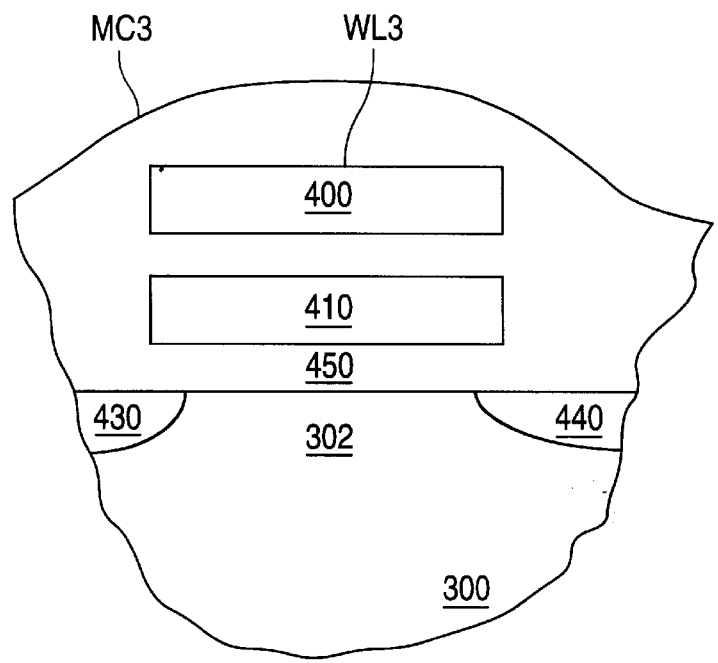
FIG. 4 is a detailed cross sectional diagram of memory cell MC3 of FIG. 3.

FIG. 4 is a detailed cross sectional diagram of memory cell MC3 of FIG. 3. The structures of the other memory cell is MC1 to MC2 and MC4 to MC16 contain similar elements as used to describe MC3. Referring to FIG. 4, memory cell MC3 has a control gate 400 overlying a floating gate 410 which is separated from substrate 300 by lower insulating layer 450. Substrate 300 includes p-well body region 302, N30 source region 430 and N+ drain region 440.

Referring again to FIG. 3, the word line WL3 of memory cell MC3 selected for programming or erasing and the unselected word lines WL1 to WL2 and WL4 to WL16, which are not shown in FIG. 3, are coupled to negative and positive charge pumps 310 and 320 with respective negative and positive gate charge lines 312 and 322 for selectively asserting a respective negative and positive voltage on the controgates 400 of memory cell is MC1 to MC16. Negative and positive charge pumps 310 and 320 are coupled to substrate line 306 with respective negative and positive body charge lines 314 and 324 for the respective negative and positive charging of the p-well body regions 302 of althe memory cell is MC1 to MC16. Controller 330 is configured to assert signals over negative and positive signal lines 332 and 334 to respective negative and positive charge pumps 310 and 320 to implement programming and erasing of memory cell is MC1 to MC16 as described below.

The programming and erasing of the memory cell is MC1 to MC16 using memory cell MC3 as an example is described below with reference to FIGS. 2–4. In programming, controller 330 first determines that a programming operation is requested for a selected memory cell (e.g. memory cell MC3). Controller 330 then activates positive charge generator 320 to assert a positive voltage on positive gate charge line 322 to bias control gate 400 of memory cell MC3 to a predetermined positive voltage of, for example, 10 volts and activates negative charge pump 310 to charge p-well body regions 302 of memory cell is MC1 to MC16 to a predetermined negative voltage level of, for example, minus 10 volts.

In a memory cell MC3 which has a tunneling threshold voltage of 20 volts and a predetermined negative voltage of minus 10 volts on p-well body region 302, a control gate tunnel threshold voltage is reduced to only 10 volts. "Controgate tunnel threshold voltage" is defined as the voltage of the control gate 400 relative to ground that would induce Fowler-Nordheim tunneling whereas "tunneling threshold voltage" is defined as the voltage of the control gate 400 relative to ground that would induce Fowler-Nordheim tunneling when body region 302 is grounded.

With positive 10 volts applied to the control gate 400 of memory cell 1, electrons tunnefrom p-well body region 302 into floating gate 410 of the selected memory cell MC3 to complete programming of the memory cell MC3. The controller 330 further activates charge generators 310 and 320 to maintain a low voltage level on all control gates 400 of unselected memory cell is MC1, MC2, and MC4 to MC16 (hereinafter, "unselected memory cell is") such that any Fowler-Nordheim tunneling effect in these memory cell is MC1, MC2, and MC4 to MC16 is negligible. Naturally, this low voltage level is lower than 10 volts and may be, for example, ground.

In an erasing operation, controller 330 first determines that an erasing operation is requested. When an erasing operation is requested, controller 330 activates positive charge generator 320 to assert a positive voltage on positive body charge line 324 to bias the substrate 300 and p-well body regions 302 of memory cell is MC1 to MC16 to positive 10 volts. Controller 330 activates negative charge pump 310 to charge the control gate 400 of memory cell is MC1 to MC16 to negative 10 volts volts which generates electromagnetic forces equivalent to the electromagnetic forces generated when the control gate 400 is grounded and the substrate 300 is biased at 20 volts. Thus, in memory cell is MC1 to MC16 which require, in one embodiment, 20 volts between control gate 400 and body region 302 in order for tunneling to occur between floating gate 410 and body region 302, negative charge is removed (i.e. erased) from floating gate 410.

In one embodiment, controller 330 activates charge generators 310 and 320 to maintain a low charge on the controgates 400 of the unprogrammed memory cell is MC1 to MC2 and MC4 to MC16 such that Fowler-Nordheim tunneling does not occur in these memory cell is MC1, MC2, and MC4 to MC16. Since the programming and erasing of memory cell is MC1, MC2, and MC4 to MC16 are performed in a similar manner as described above with reference to memory cell MC3, the above description enables a new structure and method for the programming and erasing of memory cell is MC1 to MC16.

In the above embodiment, a positive voltage of only 10 volts need be applied to the control gate 400 or substrate 300 in order to respectively program and erase a memory cell MC3 which requires a 20 volt potential difference between the control gate 304 and body 314 in order for tunneling to occur. Therefore, the peripheral support circuitry need only be configured to apply 10 volts at control gate 304. This represents a significant reduction in the voltage level that the voltage delivery circuitry must support in order to program and erase a NAND array EEPROM. Therefore, the present invention significantly reduces the problems associated with the high voltage requirements of the peripheravoltage delivery circuitry of the prior art NAND array EEPROM.

Although the above embodiment has been described with reference to a memory cell MC3 which has a tunneling threshold voltage of 20 volts, the present invention also applies to a memory cell MC3 which has a tunneling threshold voltage other than 20 volts. Furthermore, in the above tunneling threshold voltage of 20 volts, half (10 volts) is attributed to the negative charge on either of p-well body region 302 or control gate 400 and the other half (10 volts) is attributed to the positive charge on the other of the p-well body region 302 or control gate 400. In another embodiment, the tunneling threshold voltage of memory cell MC3 is reached by negative charge pump 310 causing more or less than half of the voltage difference. For example, the present invention can apply to a memory cell MC3 having a tunneling threshold voltage of only 5 volts with p-well body region 302 biased at −1 volt and control gate 400 biased at 4 volts. The following chart shows a non-exhaustive list of possible ratios (hereinafter, "split ratio") of the absolute value of the predetermined negative voltage over the tunneling threshold voltage given a tunneling threshold of, for example, 20 volts. All voltages are with respect to ground.

TABLE 1

| Split Ratio Range (x) | Predetermined Negative Voltage (y) | Control Gate Tunneling Threshold Voltage (z) |
| --- | --- | --- |
| x > 1% | y < −0.2 volts | z < 19.8 volts |
| x > 2% | y < −0.4 volts | z < 19.6 volts |
| x > 5% | y < −1 volt | z < 19 volts |
| x > 10% | y < −2 volts | z < 18 volts |
| x > 20% | y < −4 volts | z < 16 volts |
| x > 40% | y < −8 volts | z < 12 volts |
| 60% > x > 40% | −12 volts < y < −8 volts | 8 volts < z < 12 volts |
| x = 50% | y = −10 volts | z = 10 volts |

Although the above description refers to separate charge pumps 310 and 320 and a separate controller 330, charge pumps 310 and 320 and controller 330 can be integrated or contain parts that are implemented in separate components. Furthermore, although memory cell is MC1 to MC16 have been described as being NMOS type, the present invention may also implement PMOS type memory cell is.

Although the present invention has been described with reference to specific embodiments, these embodiments are illustrative only and not limiting. Many other applications and embodiments of the present invention wilbe apparent in light of this disclosure and the following claims.

We claim:

1. A circuit comprising:

a first floating gate memory cell having a control gate tunneling threshold voltage and a tunneling threshold voltage and comprising a control gate, a floating gate, a body region and an insulating layer between said floating gate and said body region;

a second floating gate memory cell coupled in series with said first floating gate transistor;

a negative charge pump coupled to said body region said negative charge pump configured to bias said body region to a predetermined negative voltage; and a positive charge pump coupled to said control gate, said positive charge pump configured to bias said control gate to a predetermined positive voltage while said body region is biased to the predetermined negative voltage, wherein the circuit is part of an EEPROM NAND array.

2. The circuit of claim 1 wherein said body region further comprises electrons sufficient to bias said body region to a predetermined negative voltage.

3. The circuit of claim 2 further comprising a positive charge pump coupled to said control gate for applying a maximum control gate voltage to said control gate, said maximum control gate voltage being greater than a control gate tunneling threshold voltage of said control gate.

4. The circuit of claim 3 wherein said predetermined positive voltage is less than said tunneling threshold voltage, whereby said maximum control gate voltage is insufficient to induce Fowler-Nordheim tunneling when said body region is grounded.

5. The circuit of claim 4 further comprising a controller coupled to said negative and positive charge pumps.

6. A method for programming a memory cell in an EEPROM NAND array, comprising:

biasing a body region of said memory cell to a negative voltage; and biasing a control gate of said memory cell to a positive voltage sufficient to tunnel electrons from said body region to a floating gate provided between said body region and said control gate, said positive voltage being insufficient to tunnel electrons from said body region to said floating gate if said body region were grounded.

7. The method of claim 6 further comprising:

before biasing said body region and said control gate, determining that a program operation is initiated; and after so determining, but before biasing said body region and said control gate, activating a negative charge generator to perform said step of biasing said body region.

8. An EEPROM NAND array comprising:

a first floating gate memory cell having a control gate tunneling threshold voltage and an absolute threshold voltage comprising:

a control gate;

a floating gate;

a body region comprising electrons sufficient to bias said body region to a predetermined negative voltage; and an insulating layer between said floating gate and said body region;

a second floating gate memory cell coupled in series with said first floating gate transistor;

a negative charge pump coupled to said body region;

a positive charge pump coupled to said control gate for applying a maximum control gate voltage to said control gate, said maximum control gate voltage being greater than said control gate tunneling threshold voltage, said maximum controlgate voltage being less than said tunneling threshold voltage; and a controller coupled to said negative and positive charge pumps.

* * * * *